Aug. 22, 1950 M. G. CROSBY 2,519,890

ANGLE MODULATED WAVE RECEIVER

Filed Dec. 9, 1944 2 Sheets-Sheet 1

INVENTOR
MURRAY G. CROSBY.
BY H. S. Grover
ATTORNEY

Aug. 22, 1950 M. G. CROSBY 2,519,890

ANGLE MODULATED WAVE RECEIVER

Filed Dec. 9, 1944 2 Sheets-Sheet 2

INVENTOR
MURRAY G. CROSBY.
BY H. S. Grover
ATTORNEY

Patented Aug. 22, 1950

2,519,890

UNITED STATES PATENT OFFICE 2,519,890

ANGLE MODULATED WAVE RECEIVER

Murray G. Crosby, Riverhead, N. Y., assignor to Radio Corporation of America, a corporation of Delaware Application December 9, 1944, Serial No. 567,421

5 Claims. (Cl. 250—20)

My present invention relates generally to improved receivers of angle modulated carrier waves, and more particularly to balanced frequency modulation (FM) receivers in which the noise-reducing characteristics of the system are improved for the conditions in which the noise peaks exceed signal voltage.

The prior conventional FM receiver requires accurate tuning to the desired FM carrier frequency to balance out amplitude variations on the carrier. Under this "balance" condition the opposed demodulator rectifiers, usually diodes, carry equal average signal current amplitudes. As the receiver is detuned from resonance with the carrier or mean frequency of the desired FM wave, the signal currents applied to the respective demodulator-rectifiers may be made unequal by the varying response of the tuned circuits of the receiver. Hence, AM (amplitude modulation) effects originally present on the FM carrier wave, or resulting from detuning of the receiver, may pass on to the audio frequency amplifier circuits. One of the reasons for employing an amplitude limiter prior to the discriminator section (or FM translating network) of the demodulator, is to reduce undesired AM effects on the carrier wave and thereby avoid the necessity for critical tuning to the exact center or carrier frequency of a desired FM wave.

According to the basic principle of my present invention the noise-reducing properties of an FM receiver system are improved without use of the usual amplitude limiter. One of the main objects of my present invention is to provide a method of, and means for, detecting angle modulated carrier waves in which peak limiting is utilized subsequent to detection.

The removal of an amplitude limiter in an FM receiver system usually impairs the noise-reducing characteristic of the system in the presence of impulse noise which is stronger than the received signal carrier. This impairment is brought about by a diminishing of the inherent noise-silencing action in the FM receiver whereby the noise impulse peaks are limited to a certain maximum value regardless of their strength. This loss is especially noticeable when the receiver is off tune.

It is an important object of my present invention to supply an auxiliary, or additional, noise limiting action which tends to restore the inherent noise-silencing action whereby there will result an improvement with respect to FM reception without, or even with, amplitude limiting.

A further object of my present invention is to provide subsequent to balanced FM detectors a network employing peak limiters whose limiting point is controlled by bias voltage derived from the rectified FM signal voltage.

Another object of my invention is to provide a peak limiter circuit subsequent to the FM detector wherein the limiter may be adjusted to function at a detector output corresponding to the maximum percentage of amplitude modulation produced by the discriminator sloping filters with full frequency modulation.

A more specific object of my present invention is to provide limiting of the combined modulation signal output of a pair of balanced detectors, the limiting being accomplished by a limiting circuit of the type disclosed and claimed in my U. S. Patent No. 2,276,565, granted March 17, 1942.

Other features of the invention will best be understood by reference to the following description, taken in connection with the drawings, in which I have indicated diagrammatically several circuit organizations whereby my invention may be carried into effect.

Figure 1:
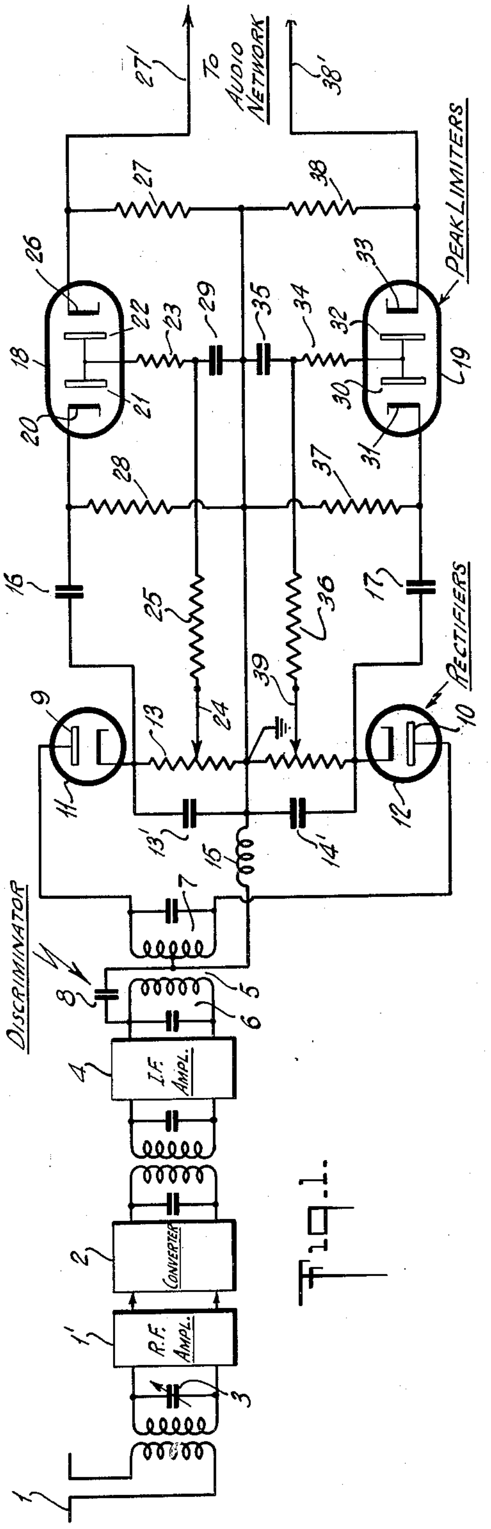
Fig. 1 shows a preferred form of the invention embodied in an FM receiver.

Referring now to the accompanying drawings, wherein like reference characters in the different figures denote similar circuit elements, there is shown in Fig. 1 an FM receiver of the superheterodyne type. While my invention is readily incorporated in any form of receiver of FM waves, I prefer to explain the preferred form of the invention in connection with a superheterodyne receiver system. It is to be understood that the present invention is not restricted to reception of FM waves, since phase modulated (PM) carrier waves could be received as well. In general, I employ the generic term "angle modulated wave" in this specification to include an FM wave or a PM wave. An FM wave is produced at the transmitter by deviating the carrier wave relative to its mean frequency to an extent proportional to the amplitude of the modulations and independent of the modulating frequency. A PM wave differs in having a frequency deviation which increases with modulating frequency. The above generic expression is, also intended to include a modulated wave of preferably constant amplitude wherein the modulation is neither pure FM nor pure PM, but contains components resembling one or both of them and is, therefore, a hybrid modulation.

In the present patent application it is assumed, by way of specific example, that the receiver is designed to operate in the FM broadcast band of 42–50 megacycles (mc.), and that each transmitter radiates an FM wave having a maximum frequency range up to 75 kilocycles (kc.) with respect to the normal transmitter frequency. These are the assigned frequency values of the present day FM broadcast band. The receiver may include any desired form of signal collector, as for example a dipole 1. The collected FM signal waves, after high frequency amplification by tunable radio frequency amplifier 1′, are applied to the converter 2 for reduction of the mean frequency value without change of the deviation. The converter 2 may be of any suitable and known construction, and is preferably preceded by one or more stages of selective radio frequency amplification. The numeral 3 designates the usual tunable selector circuits preceding the converter. The circuit 3 is to be understood as being symbolic of one or more similar selector circuits whose selecting devices, usually a variable condenser or adjustable inductor, are adjusted to receive a desired FM station. The tuning devices would, of course, preferably be adjusted accurately to resonate the respective selector circuits to the center or mean frequency of the desired FM station.

The converter 2 will, of course, include a tunable local oscillator tank circuit. The tank circuit is customarily adjusted concurrently with the tuning devices 3 so that the tank circuit will be tuned to a local oscillator frequency differing from the desired carrier frequency by the operating intermediate frequently (I. F.). The selective circuits of, and preceding, converter 2 may be of the fixedly tuned type, if desirable. The intermediate frequency is usually chosen from a range of 2 to 15 mc., say, merely by way of example, 5 mc. The converter 2 may use the well-known pentagrid tube, or it may use separate oscillator and mixer tubes. These various circuits and circuit components are very well-known to those skilled in the art of radio communication, and need only be briefly referred to.

The I. F. amplifier 4 may embody one or more amplifiers selectively tuned to the operating I. F. value of 5 mc. Of course, all signal transmission circuits between the collector 1 and the FM demodulator will be constructed so as to pass efficiently a band at least 150 kc. wide. It is, also, usual to design the signal transmission circuits to have a pass band of approximately 200 kc. in width to provide for reasonable tolerances.

Figure 2:
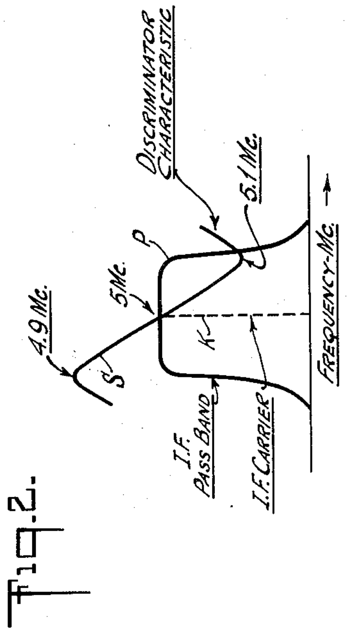
Fig. 2 illustrates ideal relations which are desirable between typical characteristics of the discriminator and preceding circuits.

The output transformer 5 of the final I. F. amplifier tube has its primary and secondary circuits 6 and 7 each tuned to the desired I. F. value. The pass band will preferably, as stated above, be chosen to be of the order of 200 kc. wide, while the mean or center frequency of the band is 5 mc. In Fig. 2 the curve P is an ideal representation of the I. F. pass band curve of transformer 5. It is to be understood that the prior I. F. selector circuits will have similar pass band characteristics.

Those skilled in the art of FM communication are fully aware of the functioning of a discriminator-rectifier of the general type disclosed in Fig. 1. Specifically, it is of the type disclosed and claimed by S. W. Seeley in his U. S. Patent No. 2,121,103 granted June 21, 1938. In place thereof there could be used the system for demodulating FM waves shown by F. Conrad in U. S. Patent No. 2,057,640, granted October 13, 1936. In general, any known form of discriminator-rectifier network may be used in combination with my invention.

Before describing the functions performed by my invention, the ideal relations depicted in Fig. 2 will first be explained. As previously stated, curve P shows a typical I. F. band pass curve of network 6, 7. The curve S is a typical discriminator characteristic having spaced peaks located at the frequencies of 4.9 mc. and 5.1 mc. The ideally linear section between the peaks has its center frequency of 5 mc. located at the center frequency of band pass curve P. When the resonance curve P of circuit 6, 7 (as well as prior selector circuits) is related to discriminator characteristic S of the discriminator circuit as shown, the two circuits are said to be in perfect alignment. While such alignment is highly advantageous, it is equally advantageous to have the mean frequency of the I. F. energy applied to transformer 5 fall at the center frequency of 5 mc. The dotted vertical line K represents the I. F. carrier or mean frequency. When the condition shown in Fig. 2 exists, there will be little need for an amplitude limiter between I. F. amplifier 4 and the discriminator circuit. So long as noise potentials in the receiving system do not exceed the signals, reception of FM signals will be satisfactory, and it will be relatively free of noise without an amplitude limiter being employed.

Should now the line K, representing the carrier frequency, be shifted from the center frequency position while remaining within the band P, there may occur considerable noise production or signal distortion because of amplitude variations resulting from working down on one of the slopes or legs of the band pass response curve. In the past an amplitude limiter was employed to reduce such effects, since it was known that the ideal relations of Fig. 2 were difficult to secure. It may, also, be pointed out that even if the I. F. carrier K is located at the center of curve P, but the curve S is shifted to one side within curve P, (i. e., the tuning of the discriminator circuits is not accurately aligned with the I. F. selector circuits) unsatisfactory and noisy reception may result, including beat note interference from an adjacent channel station. Here, again, an amplitude limiter has been previously considered to be at least a partial solution of the problem of reducing the noise.

The discriminator-rectifier network is very well known to those skilled in the art, and it is not believed necessary to described the construction and function thereof in detail. Resonant circuits 6 and 7 are magnetically coupled. The midpoint of the coil of circuit 7 is connected directly to the high potential side of circuit 6 through a direct current blocking condenser 8. The opposite sides of secondary circuit 7 are connected to the anodes 9 and 10 respectively of a pair of diodes 11 and 12. The cathodes of diodes 11 and 12 are connected together by means of the series-arranged load resistors 13 and 14.

The junction of the load resistors is established at ground potential, and the midpoint of the coil of secondary circuit 7 is connected through the I. F. choke 15 to the grounded junction of resistors 13 and 14. Each of the load resistors is bypassed by its respective I. F. bypass condenser 13′ or 14′. The discriminator network functions in the manner described in the aforesaid Seeley patent. In brief, there is induced in the tuned secondary circuit 7 a pair of signal voltages. One of these FM signal voltages is directly applied to the secondary circuit 7 from the primary circuit 6 at the midpoint of which condenser 8 is connected. Since anodes 9 and 10 are connected in parallel to the last-mentioned point, the I. F. signal voltage will be applied in parallel to the anodes. On the other hand, the magnetic coupling between circuits 6 and 7 will cause a substantially 90 degrees phase shift in the I. F. voltage induced in the secondary circuit.

This phase-shifted I. F. voltage will be applied in push-pull relation to anodes 9 and 10 relative to the midpoint of the coil of circuit 7. Hence, each anode has applied to it a parallel I. F. voltage component and a phase-shifted voltage component, but the latter components being of opposite polarity. Hence, there will be effectively applied to each of anodes 9 and 10 a resultant vector voltage. These resultant vector voltages are of equal magnitude, if the mean frequency of the I. F. signal energy is equal to the predetermined resonant frequency (5 mc.) of transformer 5. Should the mean frequency of the I. F. energy depart from the predetermined resonant frequency, then the resultant vector voltages at the respective anodes 9 and 10 will vary in relative magnitudes, depending upon the direction and extent of the aforesaid frequency departure.

For this reason the rectified voltages across resistors 13 and 14 will concurrently vary in magnitude and polarity, relative to ground potential, in accordance with the rapid frequency deviations of the received FM signals. The modulation component of the rectified voltages are taken off from the cathode ends of resistors 13 and 14 through condensers 16 and 17 respectively. Before applying these voltages to a subsequent modulation frequency network, such as a push-pull audio amplifier or a single-sided audio amplifier, the modulation voltage components are subjected to peak limiting in accordance with my present invention. Before describing the constructional details of the peak limiter network, the following discussion is provided to make clear the principle of my invention.

In a frequency modulation receiver, the discriminator that converts the frequency modulation to amplitude modulation is usually constructed so that the maximum frequency deviation produces less than 100% modulation. In the practical case, the maximum percentage of modulation realized on each detector may be of the order of 30 percent. It would be desirable to increase the percentage of modulation from 30% to 100% for the following reasons: When a signal is not present in the receiver, the limiter amplifies the noise to a high value. This noise is 100% amplitude modulated so that the limiter is ineffective in removing the amplitude modulation. The balanced detectors are, also, ineffective in removing 100% amplitude modulation. Consequently, when the receiver is detuned from the signal there results a value of noise in the loudspeaker which is greater than the maximum amplitude of a desired modulated wave. If the discriminator were able to convert the frequency modulation to 100% amplitude modulation, this noise in the absence of signal would be not greater than the maximum amplitude of the desired modulated wave, but would be equal.

There are two conditions in which this type of limiting subsequent to detection becomes effective. The first is in the conventional FM receiver with a limiter, under the condition of noise stronger than the carrier. The second is with an FM receiver in which the usual amplitude limiter is omitted. The conditions of the first case result when there is no signal tuned through the receiver. Under these conditions, the output of the limiter is 100% amplitude-modulated noise. This noise is detected by the balanced detectors, but a balance is not possible since the noise covers the whole spectrum of the sloping filters. When a signal is tuned in, maximum frequency deviation may only produce 30% amplitude modulation. Hence, in the absence of signal, a noise 100/30 times as loud as the desired signal is received. In the system of this invention, a peak limiter is inserted at the output of each detector so that the output cannot go higher than that corresponding to the 30% modulation produced by the signal. The noise in the output of the receiver in the absence of signal is thus considerably reduced.

The second condition of effectiveness of this principle is under the condition of noise stronger than the signal in a receiver which does not employ the usual amplitude limiter. Under these conditions, strong peaks of noise may produce 100%, or more, modulation at the detectors. On the other hand, the signal may only be capable of producing 30%, so that the noise will come through stronger than the maximum peaks of the signal wave. The balance of the balanced detectors is effective on this type of noise only in the absence of modulation and for the condition of accurate tuning of the receiver so that the carrier is exactly at the crossing point of the sloping filters. When the limiters of this invention are inserted subsequent to detection, the noise may be limited to the same value corresponding to about 30% modulation on the signal. This limiting is effective regardless of the presence of modulation or the condition of the tuning of the receiver. Consequently, the shortcomings due to removal of the amplitude limiter have been eliminated. This makes possible receivers with reduced radio, or intermediate, frequency gain, since removal of the limiter reduces the required degree of gain for good operation.

The peak limiters comprise tubes 18 and 19. Each of them is a double diode, say of the 6H6 type. The cathode 20 of diode 20, 21 is connected to the output terminal of condenser 16. The anodes 21 and 22 of tube 18 are connected in common to the upper end of resistor 23. The lower end of the latter resistor is connected to slider 24 through resistor 25. Slider 24 is adjustable along the length of diode load resistor 13, and functions as a source of adjustable bias for the opposed diodes 20, 21 and 22, 26. The cathode 26 of diode 22, 26 is returned to the grounded junction of resistors 13, 14 through output resistor 27. The cathode 20 of diode 20, 21 is connected to the junction of resistors 13 and 14 through resistor 28. Condenser 29 connects the lower end of resistor 23 to ground thereby establishing the said end at ground potential for I. F. currents.

The opposite limiter tube 19 has the anodes 30 and 32 thereof connected through resistors 34 and 36 to slider 39. The latter is adjustable along the load resistor 14 thereby to provide adjustable bias for the opposed diodes 31, 30 and 32, 33. Condenser 35 connects the end of resistor 34 to ground. Resistors 37 and 38 connect cathodes 31 and 33 respectively to the grounded junction of load resistors 13 and 14. It will, therefore, be seen that the output circuit connections to each of diode load resistors 13 and 14 are similar. The audio frequency signals are taken off from the outer ends of resistors 27 and 38. Since the junction of the latter is at ground potential, the cathode ends of the resistors may be connected to respective control grids of a subsequent push-pull audio amplifier (not shown).

The peak limiter tubes 18 and 19 each function in the manner described and claimed in my application Serial No. 537,340, filed May 25, 1944. The audio voltage appearing across each of load resistors 13 and 14 is applied to the respective input diodes of the limiters 18 and 19 through respective resistance-capacity couplings 16, 28 and 17, 37. Each of the diodes of the limiter tubes functions in the manner of a resistor. That is, the cathode end of load resistor 13 is connected to the output lead 27′ through a series path consisting of condenser 16, the internal cathode to anode resistance of diode 20, 21 and the internal resistance of diode 22, 26. The junction of these series-connected internal cathode to anode resistances is connected to ground through resistor 23 and condenser 29. Similarly, the output lead 38′ connects to the cathode end of resistor 14 through the series path consisting of the respective cathode to anode resistances of diodes 33, 32 and 30, 31 and condenser 17. The shunt path 34, 35 connects the junction of these last-mentioned resistances to ground.

The limiting point of the two limiters is controlled by the value of bias voltage fed to the low potential ends of resistors 23 and 34. This bias voltage is secured from the rectified signal voltage appearing across resistors 13 and 14. Resistance-condenser filters 25, 29 and 36, 35 remove the respective alternating current components of the detected signals. Deemphasis network elements are preferably inserted following the output resistors 27 and 38, because it is important to accomplish peak limiting immediately following detection where the frequency of the noise components may be as high as one half of the I. F. band width in cycles. In this respect it is important that the diode bypass condensers 13′ and 14′ be chosen in magnitude so that the highest frequency noise components will be properly detected. This constitutes a departure from standard practice, since it is customary to choose the bypass condensers for proper detection of the maximum modulation frequency.

Considering, now, the functioning of the peak limiter tubes 18 and 19, let it be assumed that the sliders 24 and 39 have been adjusted to predetermined points on their respective load resistors so as to provide a predetermined positive bias for the respective anodes of each limiter tube. Assuming, furthermore, that signals are being received, there will be developed across each of resistors 13 and 14 rectified voltage proportional to the carrier amplitude. Since the anodes in each of the limiter tubes is connected to a point on the respective load resistor which is positive relative to ground, it will be seen that the normal bias applied to the pair of diodes in each of the limiter tubes is such as to render them normally conductive. In other words, for normal signal reception the pair of diodes in each of limiter tubes 18 and 19 is biased so as to maintain the internal resistance thereof at a relatively low value. This permits ready transfer of audio frequency voltage components to the output leads 27′ and 38′.

If, now, noise components on the received signals cause rectified voltage to appear across the load resistors 13 and 14 in excess of the biasing voltage, the action of the pair of diodes in each limiter tube will be to prevent such noise peaks from being transmitted. This occurs because of the following action. Considering the limiter tube 18, it will be seen that on the positive half cycle of the noise peak the current flow through diode 20, 21 is cut off when the peak value exceeds the normal positive bias applied to anode 21. On the negative half cycle of the noise wave the current through resistor 23 increases, because the anode 21 becomes relatively more positive with respect to cathode 20. Since resistor 23 is common to the space current path of the two diodes in tube 18, increase of current flow through resistor 23 will result in anode 22 becoming less positive than its normal positive bias value. Current flow through diode 22, 26 will cease when anode 22 becomes sufficiently less positive until its normal positive bias is cancelled. Upon current flow through diode 22, 26 ceasing, transmission of audio components will be stopped. The same explanation applies to the operation of limiter tube 19.

By adjusting sliders 24 and 39 along respective resistors 13 and 14 the limiting points of the peak limiters 18 and 19 may be moved to any point between zero and 100% modulation of the modulated carrier signals applied to input circuit 7. Once decided upon, the sliders 24 and 39 remain at a fixed value of percentage of modulation since the bias for the limiter diodes is obtained from the rectified AM signal, whereby the limiting point of the limiter characteristic of each of tubes 18 and 19 moves up and down with the signal amplitude variations.

It should be clearly understood that the limiting voltage for each of the limiter tubes 18 and 19 will be equal to the bias voltage applied to the low potential ends of resistors 23 and 34. If the sliders 24 and 39 are adjusted to feed all of the rectified signal voltage to each of resistors 23 and 34, the limiter tube in each case will limit at a voltage equal to the direct current value of the rectified signal voltage. The peak voltage of the alternating current component of the rectified signal voltage is equal to the direct current value of the detector output at 100% amplitude modulation of the modulated carrier signal at input circuit 7. Thus, if the bias supplied by each of the sliders 24 and 39 is made equal to this direct current value, the limiter tubes will start limiting at a detector output corresponding to 100% amplitude modulation. If the sliders 24 and 39 are adjusted to feed, for instance, 50% of the direct current component as bias, the limiter tubes will start limiting at a detector output corresponding to 50% amplitude modulation of the input signal.

Hence, by properly adjusting the sliders 24 and 39 the limiter tubes 18 and 19 can be adjusted to start limiting at any desired percentage of amplitude modulation of the modulated carrier signals applied to the detector tubes 11 and 12. This bias adjustment is independent of the amplitude of modulated carrier signal applied to the detector tubes, since the bias which determines the limiting point for each of tubes 18 and 19 is controlled by the signal strength. This is an advantageous and desirable feature of my present invention, because in the absence of the conventional limiter stage prior to the FM detector the signal strength may vary somewhat. Accordingly, it will be seen that regardless of such signal strength variation the limiter operation will automatically be adjusted for the proper predetermined limiting point. Furthermore, when the receiver is inadvertently detuned from the desired mean or carrier frequency of a desired FM station, the amplitude of signal input to the detectors 11 and 12 varies. Here, again, the carrier-controlled bias of the limiter tubes functions to render the limiting action independent of the carrier amplitude variation.

Separate limiters are placed at the output of each detector diode, because there is more noise to be limited at that point since the latter precedes the balancing action. The limiter tubes will operate on opposite half cycles of the signal input waves. Where limiting precedes the balancing action, the limiters may reduce the noise to some extent and the balancing action still more. On the other hand, if the limiting were to follow the balancing action, the latter would reduce the noise to a level such that it will not be limited by the peak limiter.

Figure 3:
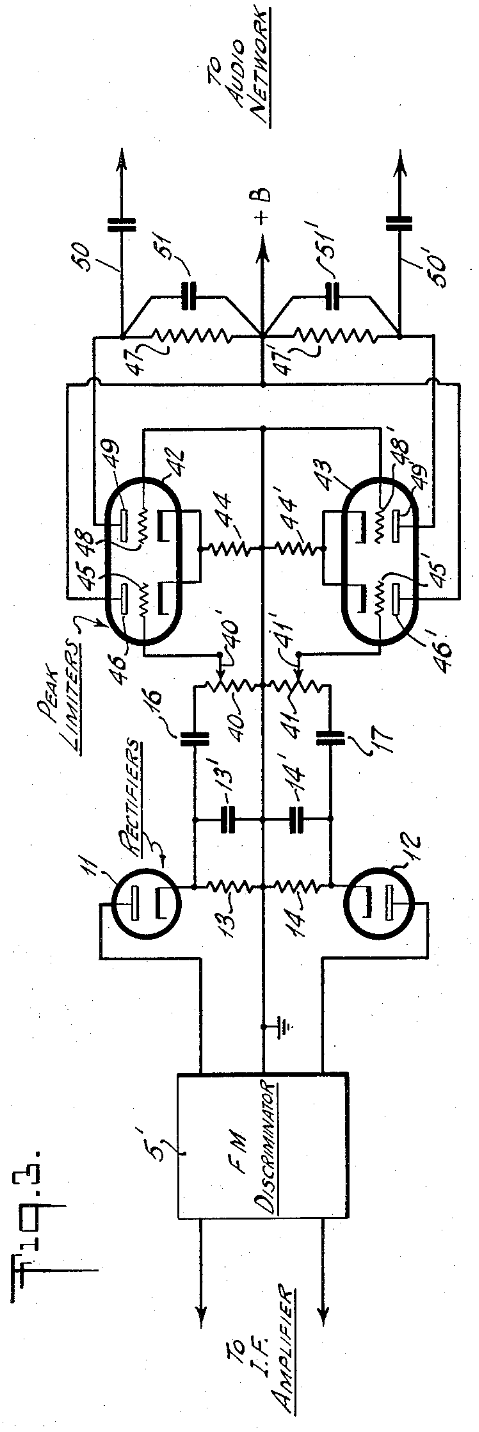
Figs. 3 and 4 show respectively different modifications of the invention.

My invention is not limited to the utilization of the particular limiter tubes shown in Fig. 1. In Fig. 3 I have shown a modification of the peak limiters in which they are replaced by limiter tubes of the type shown in my U. S. Patent 2,276,565, granted March 17, 1942. It will be noted that in the modification shown in Fig. 3 the portion of the circuit to the left of condensers 16 and 17 is similar to that shown in Fig. 1. In other words, numeral 5' denotes the FM discriminator circuit. The latter is schematically represented in Fig. 3, but it is to be understood that the discriminator circuit shown in Fig. 1 may be employed within the schematically represented rectangle 5' of Fig. 3. Load resistor 13 is shunted by a series path consisting of condenser 16 and resistor 40, while load resistor 14 is shunted by a series path consisting of condenser 17 and resistor 41. Each of resistors 40 and 41 is provided with a respective slider 40' and 41' so as to provide a pair of independently adjustable potentiometers. The pair of twin triode tubes 42 and 43 may be of any well known type, and these tubes function as peak limiters for the outputs of the FM detector diodes 11 and 12. In this circuit the limiting point for each of limiter tubes 42 and 43 is adjusted manually by means of the potentiometer sliders 40' and 41'. These adjustments would have to be changed if the signal strength changed.

The specific circuit connections of tube 42 will now be explained, it being understood that those of tube 43 are similar. For this reason the corresponding circuit connections in the case of tube 43 will bear the same reference numeral as in the case of the circuit connections of tube 42, except that in the case of tube 43 each numeral is differentiated by means of a prime designation. The common cathodes of tube 42 are connected to the grounded junction of potentiometer resistors 40 and 41 through an unbypassed resistor 44. The control grid 45 of the input triode of tube 42 is directly connected to slider 40'. The plate 46 of the input triode of tube 42 is connected to the plate (+B) voltage supply source. The input grid 48 of the second triode of tube 42 is connected in common with grid 48' to the junction of cathode resistors 44 and 44'. Plates 49 and 49' of the output triodes of tubes 42 and 43 are connected to the outer ends of resistors 47 and 47'. In other words, plates 49 and 49' are the respective output electrodes of tubes 42 and 43, and the output circuit leads 50 and 50' are connected to the plate ends of resistors 47 and 47'. Each of these output resistors is shunted by a respective condenser 51 and 51'. Condensers 51 and 51' together with output resistors 47 and 47' provide the deemphasis network of the system.

In this form of circuit the limiter tubes 42 and 43 are adjusted to start limiting at a detector output corresponding to the maximum percentage of amplitude modulation produced by the discriminator circuits with full frequency modulation. In other words, the sliders 40' and 41' will be adjusted on their respective potentiometer resistors to such points thereon that each of tubes 42 and 43 will commence limiting action in response to rectified voltages across load resistors 13 and 14 which correspond to the maximum percentage of amplitude modulation produced at the discriminator circuit during the maximum frequency modulation or frequency swings of the carrier. For the detected output voltage corresponding to noise modulation of the FM carrier in excess of the aforesaid maximum percentage of amplitude modulation there will be limiting of the signal voltage transmitted to leads 50, 50'. Reference is made to my aforesaid U. S. Patent No. 2,276,565 for a detailed explanation of the operation of a limiter tube of the twin triode type such as is disclosed herein. In view of the detailed description in the said patent it is not believed necessary to provide more than a general explanation in the present application of the functioning of the twin triode peak limiter.

Referring then to the twin triode tube 42, and it being understood that the following explanation of the operation thereof is equally true for tube 43, when the grid 45 of the input triode is swung positive, increased cathode current is drawn through resistance 44. This means that the cathodes of both triodes are made more positive with respect to ground. When the cathode of the output triode becomes more positive with respect to ground, it is equivalent to making grid 48 more negative. Thus, a positive change on the grid 45 of the input triode effects a resultant negative change on grid 48 of the output triode. This phase reversal causes the output triode to effect the negative grid limiting for the positive half cycles of the input wave, while the input triode effects grid limiting on the negative half cycles. Thus, when the input grid 45 is swung negative, negative grid cut-off limits the change in cathode current caused by the input wave.

When grid 45 is swung negative the plate current flow through resistor 44 is reduced. This causes the grid 48 to become effectively less negative thereby causing increased plate current to flow through the output triode. The increase of plate current, however, is determined by the difference between zero grid voltage and cut-off voltage on grid 45. When the bias on grid 45 becomes sufficiently negative to cut off the input triode, no further change of the output triode current can take place so that limiting occurs. When the input grid 45 is swung positive, then the grid 48 of the output triodes is effectively swung negative until negative grid cut-off is reached for the output triode.

As I have stated heretofore, my present invention is of value even in the case where the FM receiver is provided with a limiter network prior to the FM detector. Furthermore, the invention is applicable to an FM detector whose combined detected output is utilized in conjunction with a single limiter tube of the type shown in Fig.

3. I have shown such a modification of the present invention in Fig. 4.

Figure 4:
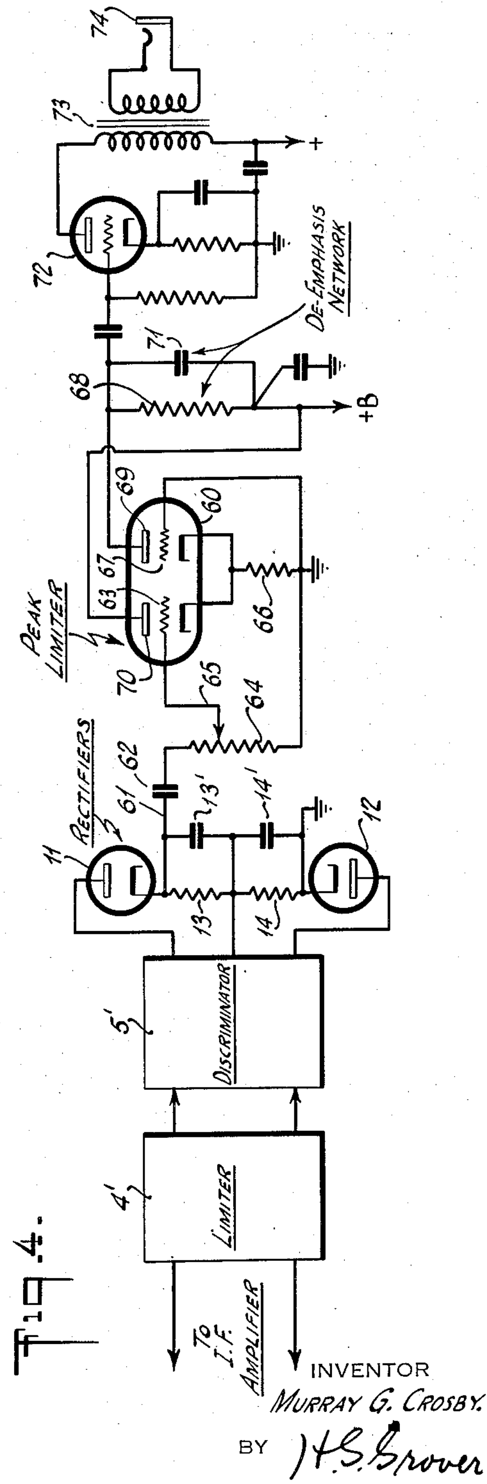

In the system shown in Fig. 4 the discriminator circuit 5' is fed with limited I. F. signal energy. The final I. F. amplifier, such as network 4 of Fig. 1, feeds its amplified FM signals into an amplitude limiter 4' of any suitable construction. Those skilled in the art of radio communication are fully acquainted with the various types of limiters capable of use at 4'. The function of the limiter 4' is to prevent signal amplitude increases above a predetermined threshold level from affecting the discriminator network 5'. The limiter 4' has a constant output so that the signal level at the discriminator 5' is constant. It has previously been pointed out that when the noise is stronger than the carrier, as when no signal is tuned in by the receiver, the output of the limiter 4' is 100% amplitude modulated noise. This noise is detected by the balanced rectifiers 11 and 12, but a balance is not possible since the noise covers the whole spectrum of the sloping filters of the discriminator. Hence, the peak limiter 60 is inserted at the output of the FM detector to limit the output so that it canont rise higher than a value corresponding to the 30% modulation produced by an FM signal when the latter is tuned in. It is pointed out in this connection that when an FM signal is tuned in, maximum frequency deviation may only produce 30% amplitude modulation at the input of one of the diode detectors. Experience has shown that the usual sloping filter discriminator converts the FM into an AM of about 30%.

The peak limiter is a twin triode tube similar in construction and function to either of tubes 42 or 43 of Fig. 3, and described in detail in my aforesaid U. S. 2,276,565. The lead 61, which takes off the modulation signal voltage, is connected to the cathode end of resistor 13. The cathode of diode 12 is grounded, and, therefore, the rectified voltages across resistors 13 and 14 are differentially combined. The cathode end of resistor 13 varies in polarity and magnitude in accordance with the frequency modulation of the received carrier. The lead 61 is connected through coupling condenser 62 to the control grid 63 of the input triode of limiter tube 60. A potentiometer 64 provides adjustment of the modulation signal voltage level at grid 63.

The slider 65 may be adjusted to a suitable limiting position. The cathodes of both triodes of tube 60 are connected in common to ground by resistor 66. The control grids 63 and 67 are connected to the grounded end of the cathode resistor 66. The output resistor 68 is connected in circuit with plate 69 and the +B terminal of the direct current supply source, while plate 70 is connected to the plate potential (+B) supply terminal. A deemphasis network is provided by shunting resistor 68 with condenser 71. The constants of network 68, 71 are chosen to provide deemphasis of the higher audio frequency components, it being assumed that during FM transmission the higher audio frequency components were preemphasized.

The audio frequency amplifier tube 72 has its input electrodes coupled across the output resistor 68. The amplifier is provided with suitable and well-known circuits for audio frequency signal amplification. The output transformer 73 feeds the amplified audio signals to an output jack 74. This modification of the invention has the advantage that the effective signal level at the discriminator 5' is kept substantially constant regardless of the accuracy of tuning of the receiver. This is due to the balancing action of the opposed rectifiers in which the output of one increases as the output of the other decreases due to detuning of the receiver. This permits a fixed limiting point regardless of receiver tuning. The peak limiter functions as explained in connection with tube 42. Upon the positive half cycle of the input wave, assuming an amplitude above the limiting point, the grid 63 causes the space current through resistor 66 to increase. Effectively this acts as if the grid 67 is being negatively biased to plate current cutoff. On the negative half cycle of the input wave the grid 63 is caused to become sufficiently negative to limit the change in cathode current at the output triode.

While I have indicated and described several systems for carrying my invention into effect, it will be apparent to one skilled in the art that my invention is by no means limited to the particular organizations shown and described, but that many modifications may be made without departing from the scope of my invention.

What I claim is:

1. In combination with a pair of balanced detectors for angle modulated carrier waves, a first peak limiter having input terminals coupled over a first audio path to the output of one of said detectors, a second peak limiter having input terminals coupled over a second audio path to the output of the second detector, a common audio output circuit coupled to the output terminals of each of said limiters, each of the peak limiters consisting of a pair of opposed diodes, and respective carrier-responsive direct current voltage connections for separately controlling the bias of each pair of the opposed diodes.

2. In combination with a pair of balanced rectifiers for frequency modulated carrier waves, an output load circuit for each of said rectifiers, said output load circuits being connected in push-pull, a first peak limiter having input terminals coupled over a first audio path to the output load circuit of one of said rectifiers, a second peak limiter having input terminals coupled over a second audio path to the output load circuit of the second rectifier, a common audio output circuit coupled in push-pull to the output terminals of each of said limiters, and respective direct current voltage connections separate from audio paths, responsive to the rectified carrier output voltage across each output load circuit, for controlling the conductivity of each peak limiter in the same sense.

3. In combination with a pair of balanced detectors for frequency modulated carrier waves, an output load circuit for each of said detectors, said output load circuits being connected in push-pull, a first peak limiter having input terminals coupled over a first audio path to the output load circuit of one of said detectors, a second peak limiter having input terminals coupled over a second audio path to the output load circuit of the second detector, and a comon push-pull audio output circuit coupled to the output terminals of each of said peak limiters, and each of said limiters having a respective adjustable direct current voltage connection separate from said audio paths from its input terminals to the respective detector output load circuit, thereby to limit the amplitude of detected noise voltages in excess of a maximum amplitude.

4. In combination with a pair of balanced detectors for angle modulated carrier waves, an output circuit for each of said detectors, said output circuits being connected in push-pull, a first peak limiter having input terminals coupled over a first audio path to the output circuit of one of said detectors, a second peak limiter having input terminals coupled over a second audio path to the output circuit of the other one of said detectors, an audio output circuit coupled to the output terminals of each of said limiters, said audio output circuits being connected in push-pull, and direct current voltage connections separate from said audio paths, each responsive to the rectified carrier output of one of said detectors for respectively controlling the bias of each of said limiters.

5. In combination with a pair of balanced detectors for angle modulated carrier waves, an individual output circuit for each of said detectors, said output circuits being connected in push-pull, a first and a second audio output circuit, a first audio path connected between the output circuit of one of said detectors and said first audio output circuit, a second audio path connected between the output circuit of the other one of said detectors and said second audio output circuit, a first peak limiter connected serially in said first audio path, a second peak limiter connected serially in said second audio path, said audio output circuits being connected in push-pull to combine the limiter outputs differentially, and each of said limiters having an adjustable direct current voltage connection to its respective detector output circuit separate from said audio paths, thereby to limit the maximum amplitude of detected noise voltages.

MURRAY G. CROSBY.

REFERENCES CITED

The following references are of record in the file of this patent:

UNITED STATES PATENTS

| Number | Name | Date |
|---|---|---|
| 2,263,633 | Koch | Nov. 25, 1941 |
| 2,276,565 | Crosby | Mar. 17, 1942 |
| 2,349,881 | Peterson | May 30, 1944 |
| 2,362,806 | Dome | Nov. 14, 1944 |
| 2,385,211 | Konrad | Sept. 18, 1945 |
| 2,393,400 | Noviks | Jan. 22, 1946 |